United States Patent [19]

Felps et al.

[11] Patent Number: 5,424,918

[45] Date of Patent: Jun. 13, 1995

[54] UNIVERSAL HYBRID MOUNTING SYSTEM

[75] Inventors: Jimmie D. Felps, Colorado Springs; Frank P. Leri, Pueblo; Donald E. Schott; Timothy A. Figge, both of Colorado Springs, all of Colo.

[73] Assignee: Hewlett-Packard Company, Palo Alto, Calif.

[21] Appl. No.: 220,887

[22] Filed: Mar. 31, 1994

[51] Int. Cl.$^6$ .............................................. H05K 7/20
[52] U.S. Cl. .................................. 361/704; 257/719; 439/78
[58] Field of Search ............... 174/16.3; 257/704, 706, 257/707, 713, 718, 719; 439/55, 64, 78, 485; 165/80.3, 185; 361/690, 702, 704, 718, 719, 722, 760, 770, 773, 783, 791; 324/158 F, 754, 158.1, 73.1

[56] References Cited

U.S. PATENT DOCUMENTS

| 4,371,912 | 2/1983 | Guzik | 361/684 |
| 4,455,537 | 6/1984 | La Prade et al. | 333/33 |
| 4,731,693 | 3/1988 | Berg | 361/719 |
| 4,922,376 | 5/1990 | Pommer et al. | 361/386 |
| 5,019,940 | 5/1991 | Clemens | 361/723 |
| 5,208,731 | 5/1993 | Blomquist | 361/386 |
| 5,251,098 | 10/1993 | Schmidt | 361/710 |

OTHER PUBLICATIONS

Augat Inc., Interconnection Products Division, 452 John Dietsch Blvd., Attleboro Falls, MA 02763 Pad Array Interface brochure, 6 pages.
Ormond, Tom. "Surface-mount sockets expand design options" EDN, Jan. 20, 1992, pp. 71–78.

Primary Examiner—Gerald P. Tolin
Attorney, Agent, or Firm—Patrick J. Murphy

[57] ABSTRACT

A universal system for mounting hybrid circuits to printed circuit boards is presented. This universal hybrid mounting system comprises a bottom plate, a frame, a top plate, a heat sink and mounting hardware including a spring. A hybrid circuit package is securely attached to one side of the frame using the top and bottom plates and mounting hardware. The other side of the frame is brought into contact with a printed circuit board (PCB). The PCB comprises a plurality of landing pads which may be gold-plated. The frame comprises a plurality of compliant pins that electrically connect the hybrid to the landing pads of the PCB. The heat sink, in conjunction with the spring, are provided to accommodate high power hybrid packages.

8 Claims, 6 Drawing Sheets

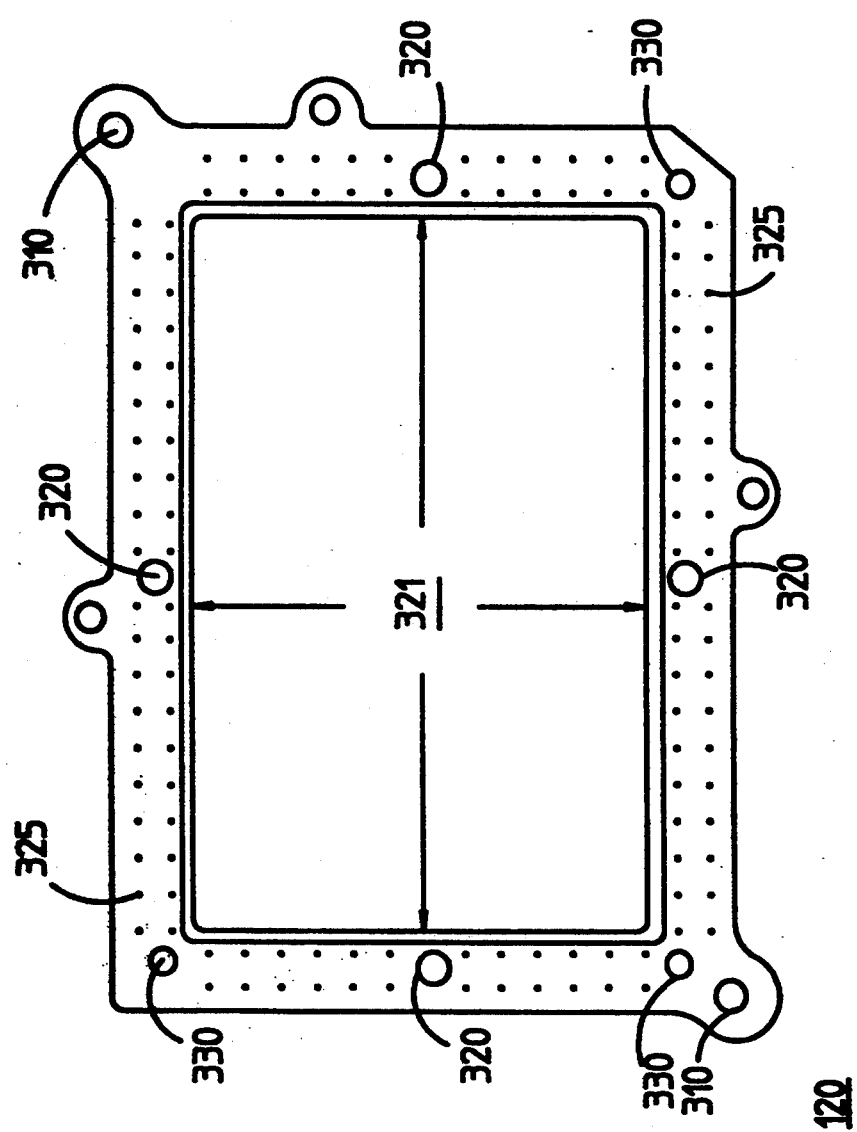

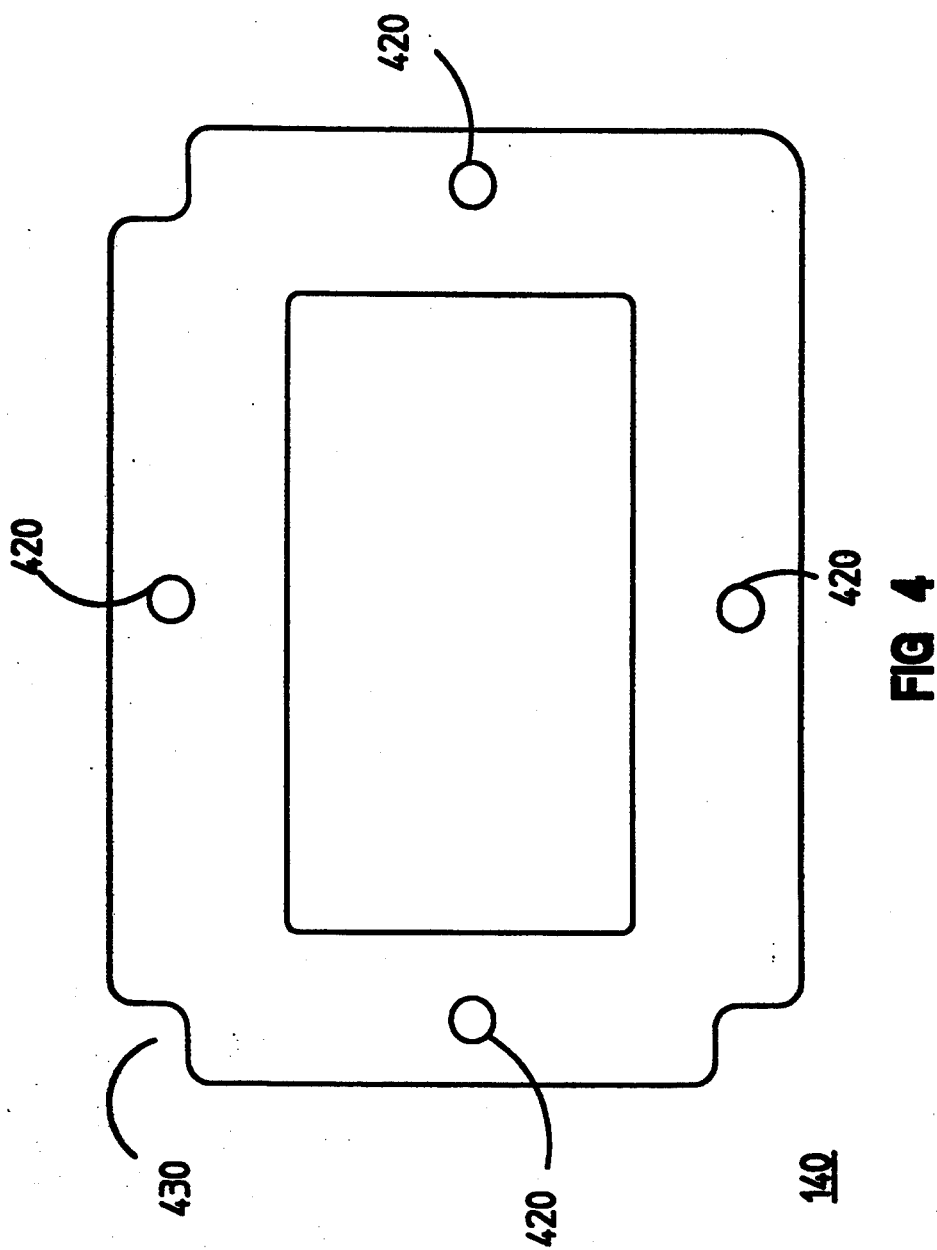

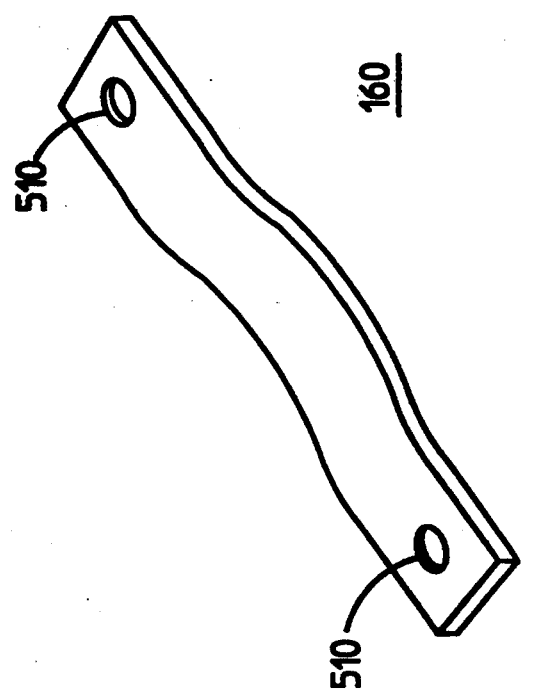

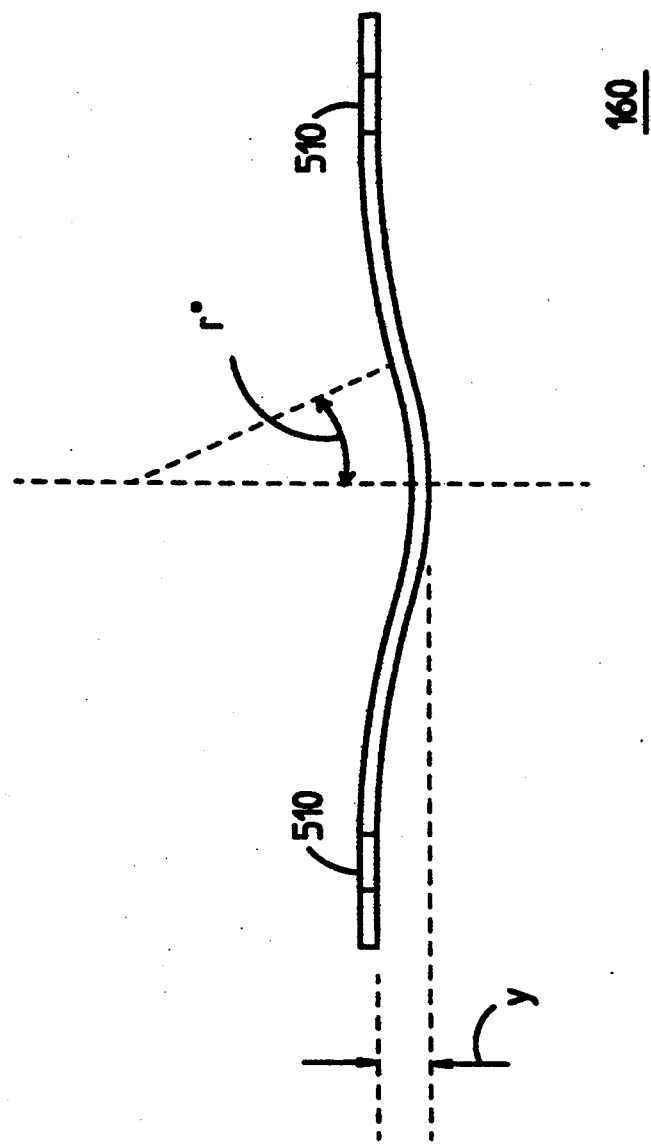

UNIVERSAL HYBRID MOUNTING SYSTEM

The present invention relates generally to hybrid circuits and more particularly to a universal system for mounting hybrid circuits to printed circuit boards.

Hybrid circuits can be fabricated on an insulating substrate comprised of an alumina or similar ceramic. The hybrid circuit combines any number of thick- or thin-film components, semiconductor devices and discrete parts such as capacitors. Hybrid circuits are typically employed in high frequency and microwave applications, although low frequency applications can also be implemented. In many cases, an insulated lid is attached to the substrate encapsulating the circuitry. In high power applications, it is often desirable to include a heat sink. Typically, a heat sink is directly attached to the inactive side of the hybrid with thermal epoxy.

Once the hybrid circuit is constructed and prior to final packaging, external connections, or mounting systems, are required to interface with the outside world. A common external connector is a wire which is reflow soldered to an output pad on the substrate. This wire is then soldered to an external system, such as a printed circuit board. Typically, hybrid circuits have many output pads needing many wires. The assembly thus becomes time-consumptive. Other mounting systems include clip-on terminals and edge connectors. The clip-on terminals are similar to wire assembly, requiring soldering to the substrate's output pads, but are easier to initially connect to the substrate (i.e., they "clip-on"). Edge connectors do not need to be soldered to the substrate, but they do take up more real estate that clip-on terminals. Both types of external connectors require soldering to attach to a printed circuit board.

One type of mounting system that has been developed for integrated circuits (IC) such as microprocessors is known as a surface-mount socket. These sockets can interface an IC to a printed circuit board without solder. One drawback of these sockets is that they are only available in two sizes: one being equivalent to a typical microprocessor footprint and one slightly smaller. Thus, to date, there has been no socket constructed to receive a hybrid package.

Several problems can arise when using these mounting systems, many being encountered in the soldering step taken to attach the hybrid to a printed circuit board (PCB). Care must first be taken when soldering the hybrid package to the PCB to avoid solder bridges and solder balls. Once the hybrid package is soldered to the PCB, it becomes difficult to remove the package, especially in the field. Another problem is system testability. The design engineer typically has two options: (1) test the hybrid package before attachment to the PCB or (2) attaching the hybrid to the PCB via soldering before testing. There are several drawbacks with both options. In the first instance, there is no capability to test in the "real world." For example, the interconnect between the hybrid and the PCB cannot be tested. In the second instance, the hybrid must be replaced if a problem is encountered during test; this process requires that the external leads be reheated to break the solder joints.

While the socket mounting system describe above can overcome some of these solder problems in IC applications, there have been no surface-mount sockets designed for hybrids. Another problem is that, typically, surface-mount sockets have an integrated clamping cover to keep the IC package in place. This clamping cover cannot easily accommodate a heat sink for high power applications.

The present invention overcomes these problems by providing a universal mounting system for hybrid circuit packages. The present mounting system comprises a bottom plate, a frame, a top plate, a heat sink and mounting hardware including a spring. A hybrid is securely attached to one side of the frame using the plates and mounting hardware while the other side of the frame is brought into contact with a printed circuit board (PCB). The frame comprises a plurality of compliant pins that electrically connect the hybrid to the PCB.

One advantage of the present invention is that a hybrid package can be mounted to a PCB without the use of solder. This facilitates field replacement and "real world" testing. An added benefit is the fact that the universal hybrid mounting system has been designed with high power applications in mind: the heat sink is an integral part of the mounting system.

BRIEF DESCRIPTION OF THE DRAWINGS

FIG. 3 shows a top view of the frame according to the present invention.

FIG. 4 shows a top view of the top plate according to the present invention.

FIGS. 5a and 5b show perspective top and side views of the spring according to the present invention.

DETAILED DESCRIPTION OF THE PREFERRED EMBODIMENT

A universal hybrid mounting system is presented. The universal hybrid mounting system provides a modular, solderless mounting system for hybrid packages. When constructed, the land-to-land interconnect scheme forms an aligned "sandwich" which has a footprint that is smaller than conventional hybrid mounting packages.

Figure 1:
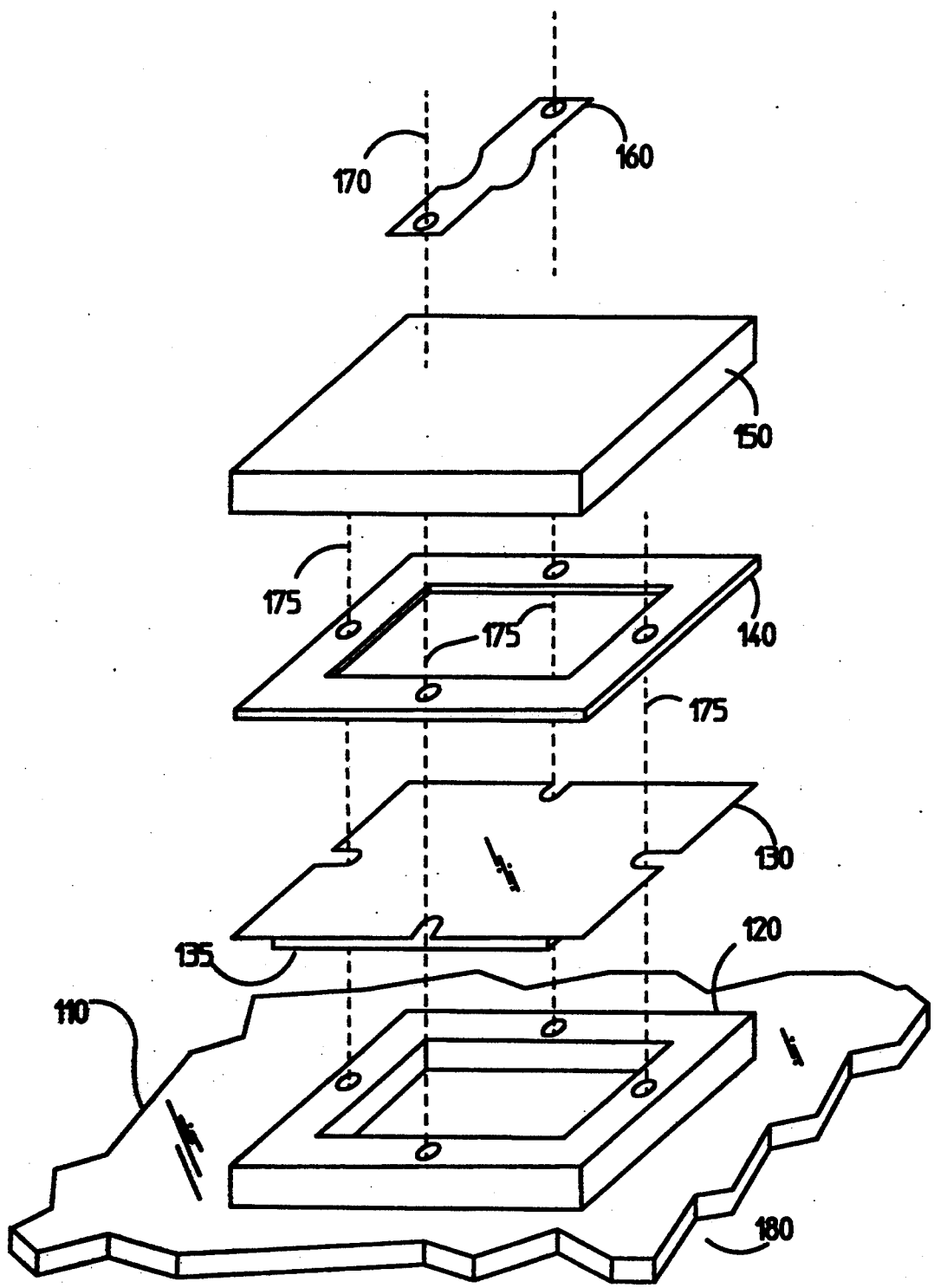
FIG. 1 shows an exploded view of the universal hybrid mounting system according to the present invention.

FIG. 1 shows an exploded view of the universal hybrid mounting system. The hybrid package 130 is attached and electrically connected to a printed circuit board (PCB) 110 using a frame 120. The hybrid package includes a lid 135 which provides electrical isolation and environmental protection. The lid 135 encapsulates the active customizable region of the hybrid 130. The customizable region can accommodate a variety of components such as thick-film, thin-film and co-fired ceramic circuitry. For example, thick-film components can be fabricated directly upon the customizable region. These thick-film components can then be either passively or actively trimmed to a wide range of values resulting in passive elements (e.g., resistors, inductors, capacitors). Active components such as bare silicon, or gallium arsenide, integrated circuits can be attached to the substrate 104 within the customizable region via wire, ribbon or mesh bonding. Surface mount components can be soldered to the customizable region directly. Output pads are placed along the periphery of the hybrid substrate and are electrically connected to the customizable region.

The hybrid 130 is mounted upside down to provide easy access to the inactive backside for thermal dissipation. The frame 120 comprises a plurality of compliant pins (see FIG. 3) which extend vertically through the frame from the hybrid 130 to landing pads on the PCB 110. In a preferred embodiment, there are 128 landing pads which may be gold-plated on the PCB 110. A top plate 140 is disposed above the hybrid 130 and is attached to the frame 120 and a bottom plate 180 via first fasteners 175 (shown as dotted lines). In a preferred embodiment, the first fasteners 175 are screws, also known as "standoff" screws, which have a threaded end and a receiver end. The threaded end has a diameter substantially the same as the threaded holes in the bottom plate 180. The receiver end has a diameter slightly larger than the threaded end. The receiver end also has threaded holes to receive a second screw-like fastener. Other fasteners may be used such as clips, snap-in plugs, and epoxy with slight modifications to the universal hybrid mounting system.

A heat sink 150 (shown here without the extruded radiant arms) is disposed above the top plate 140. The heat sink 150 is connected to the top plate 140 via a spring 160 which is directly attached to the top plate 140 with second fasteners 170. In a preferred embodiment, these second fasteners are screws which have threaded ends that fit into the receiver end of the first fasteners 175. Other second fasteners such as snap-in plugs may be used without departing from the scope of the invention. The heat sink 150 has a thermal pad (not shown), which can be made of graphite for example, attached to the underside of the heat sink 150. The thermal pad comes into direct contact with the inactive backside of the hybrid 120. The spring 160 applies enough force to the heat sink 150 to keep this thermal pad in constant contact with the hybrid 130. Thermal transfer from the hybrid 130 to the heat sink 150 is aided by a thin metallization layer that is applied to the backside of the hybrid 130.

To facilitate assembly of the universal hybrid mounting system, alignment pins (see FIG. 3) are provided in the frame 120 which extend both downwardly and upwardly from the frame 120. There are receptor holes in the PCB 110 to accept the alignment pins when the frame 120 is placed upon the PCB 110. Holes (not shown) in the hybrid 130 facilitate correct placement of the hybrid 130 onto the frame 120. Finally, as will be seen in FIG. 4, corner cut-outs are provided on the top plate 140 to additionally aid in alignment. In a preferred embodiment, there are three alignment pins; this forces the person who is assembling the universal hybrid mounting system to assemble the system correctly. Other alignment configurations could be used to facilitate assembly without departing from the scope of the present invention.

Figure 2:
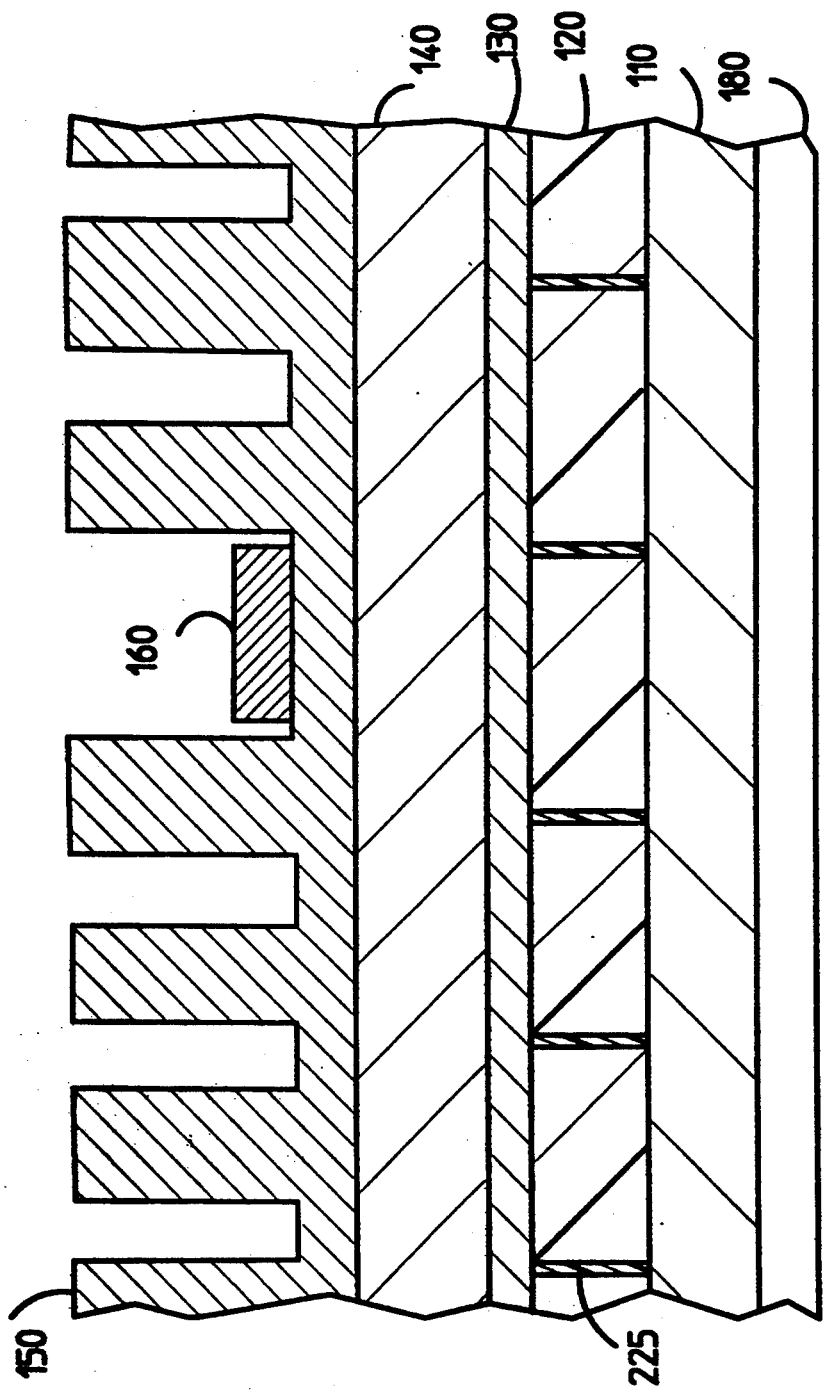
FIG. 2 shows an exposed side view of the universal hybrid mounting system.

FIG. 2 shows an exposed side view of the universal hybrid mounting system. The heat sink 150 is shown here with the extruded radiant arms. A gap sufficiently large enough to accept the spring 160 is present in the heat sink 150. The "sandwich" configuration of the universal hybrid mounting system is more evident in FIG. 2, with the heat sink 150 forming the top layer and the bottom plate 180 forming the bottom layer. The bottom plate is attached to the backside of the PCB 110 with epoxy. In a preferred embodiment, the maximum epoxy applied is 0.05 millimeters thick. This ensures structural stability without epoxy bleed. Further, once the universal hybrid mounting system is fully assembled, the first fasteners (item 175 in FIG. 1) will be screwed into threaded holes in the bottom plate 180 thus completing mechanical assembly. A plurality of compliant pins 225 reside within the frame 120. The compliant pins 225 provide direct electrical contact between the output pads of the hybrid 130 and the PCB 110.

FIG. 3 shows a top view of the frame according to the present invention. The frame 120 is rectangular in shape, having a rectangular clearance 321 to accept the hybrid (item 130 in FIG. 1). In a preferred embodiment, the frame 120 is made of a liquid crystal polymer or other insulator material. Two fastener holes 310 are positioned at opposite corners to accept a third fastener. This third fastener, which may be a flat-headed screw, firmly attaches the frame 120 to the PCB (item 110 in FIG. 1). Four holes 320 are placed along the periphery of the frame 120 to accept the first fasteners (item 175 in FIG. 1). Alignment pins 330 are shown in three of the four corners of the frame 120. These alignment pins 330 facilitate final assembly of the universal hybrid mounting system. A plurality of contact locations 325 are positioned along the periphery of the frame 120. The contacts 325 are placed in a double row to provide more contacts than are possible with conventional mounting systems such as edge clips. The contact locations 325 seen here are really one end of a tubular hole that runs top to bottom through the frame 120. In a preferred embodiment, there are 128 contact locations. Within these tubular holes, compliant pins can be inserted to provide the electrical contact from hybrid to PCB. While each location 325 may accept a compliant pin, it is only necessary to have a number equal to the hybrid's lead requirement. For example, one hybrid may only have 20 leads while another hybrid may have 100 leads. For each instance, an equivalent number of compliant pins can be used to accommodate the lead configuration of the hybrid; this saves the cost of unused pins. Other frame embodiments with more contact locations can be used without departing from the scope of the present invention. In a preferred embodiment, the compliant pins are pad array interface contact pins available from Augat, Inc., 452 John Dietsch Boulevard, Attleboro Falls, Mass.

FIG. 4 shows a top view of the top plate according to the present invention. The top plate 140, which can be made of metal, has four alignment holes 420 through which the first fastener (item 175 in FIG. 1) passes. The receiver end of the first fastener has a diameter slightly larger than the alignment hole 420. Cutouts 430 at three corners facilitate assembly when these cutouts are lined up with the alignment pins (item 330 in FIG. 3) of the frame.

FIGS. 5a and 5b show perspective top and side views of the spring according to the present invention. The spring 160, which may be made of metal, has two holes 510 to accept the second fastener (item 170 in FIG. 1). A slight bend is present in the spring such that the radial angle r is equal to approximately 24°. The y displacement from one end to the low center point is approximately 3 centimeters. When the spring 160 is fastened to the assembly, the spring provides sufficient force to the heat sink to keep the thermal pad is constant contact with the backside of the hybrid.

In a preferred embodiment, the various parts of the universal hybrid mounting system are available from Hewlett-Packard Company, 3000 Hanover Road, Palo Alto, Calif. Table 1 lists the parts and associated part numbers.

TABLE 1

| Universal Hybrid Mounting System Parts List | |
| --- | --- |
| Part Description | Part Number |
| Bottom Plate | 54542-04101 |
| Printed Circuit Board | 54542-26501 |
| Frame | 54542-67601-2 |
| Hybrid | 1NB7-8290 |
| Top Plate | 54542-04102 |
| Heat Sink (with thermal pad) | 54542-21101 |
| Screw | 0515-2363 |
| Standoff Screw | 54542-22401 |
| Spring | 54542-09101 |
| Mounting Screw | 0515-0365 |

We claim:

1. A hybrid mounting system for mounting a hybrid package on a PCB, the system comprising:
   a bottom plate disposed beneath the PCB;
   a frame disposed above the PCB, the frame having first and second sides, the first side connected to the PCB, the second side connected to the hybrid package;
   a top plate, disposed above the hybrid package and the frame, the top plate being securely attached to the bottom plate using mounting hardware;
   a heat sink disposed above the top plate; and
   a spring for securely attaching the heat sink to the mounting hardware.

2. The hybrid mounting system in claim 1, wherein the PCB comprises a plurality of landing pads.

3. The hybrid mounting system in claim 2, wherein the frame comprises at least one compliant pin, said at least one compliant pin having first and second ends, the first end electrically connected to the hybrid, the second end electrically connected to one of the plurality of landing pads.

4. The hybrid mounting system in claim 2, wherein the frame comprises a plurality of compliant pins, each of said plurality of compliant pins having first and second ends, the first ends of the plurality of compliant pins being electrically connected to the hybrid, the second ends of the plurality of compliant pins being electrically connected to the plurality of landing pads.

5. The hybrid mounting system in claim 4, wherein the bottom plate has first and second threaded holes.

6. The hybrid mounting system in claim 5, wherein the mounting hardware comprises first and second standoff screws, each of the standoff screws having a threaded end and a receiver end, the threaded end of each standoff screw being screwed into the first and second threaded holes of the bottom plate.

7. The hybrid mounting system in claim 6, wherein the receiver end of first and second standoff screws have threaded holes.

8. The hybrid mounting system in claim 7, further comprising first and second screws each having threaded ends for screwing into the threaded holes of the receiver ends of the first and second standoff screws, the first and second screws being disposed above the spring for securely attaching the heat sink to the mounting hardware.

* * * * *